United States Patent [19]

Chin et al.

[11] Patent Number: 4,920,065
[45] Date of Patent: Apr. 24, 1990

[54] METHOD OF MAKING ULTRA DENSE DRAM CELLS

[75] Inventors: Daeje Chin, Seoul, Rep. of Korea; Sang H. Dhong, Mahopac, N.Y.

[73] Assignee: International Business Machines Corporation, Armonk, N.Y.

[21] Appl. No.: 428,100

[22] Filed: Oct. 27, 1989

Related U.S. Application Data

[62] Division of Ser. No. 264,418, Oct. 31, 1988, Pat. No. 4,894,697.

[51] Int. Cl.$^5$ .............................. H01L 21/265
[52] U.S. Cl. .................... 437/52; 437/38; 437/47; 437/60; 437/203; 437/228; 437/919
[58] Field of Search ............ 437/38, 47, 52, 60, 437/203, 228, 919; 156/463, 644; 357/23.6, 51; 365/188, 189

[56] References Cited

U.S. PATENT DOCUMENTS

4,630,088 12/1986 Ogura et al. .................. 357/23.6
4,670,768 6/1987 Sunami et al. .................. 357/23.6

FOREIGN PATENT DOCUMENTS

0198590 3/1986 European Pat. Off. ......... 57/23.6

*Primary Examiner*—Brian E. Hearn
*Assistant Examiner*—T. Thomas
*Attorney, Agent, or Firm*—Thomas J. Kilgannon, Jr.

[57] ABSTRACT

This invention relates generally to dynamic random access, semiconductor memory arrays and more specifically relates to an ultra dense dynamic random access memory array. It also relates to a method of fabricating such arrays using a plurality of etch and refill steps which includes a differential etching step which is a key step in forming insulating conduits which themselves are adapted to hold a pair of field effect transistor gates of the adjacent transfer devices of one device memory cells. The differential etch step provides spaced apart device regions and an insulation region of reduced height between the trenches which space apart the memory cells. The resulting structure includes a plurality of rows of vertically arranged field effect transistors wherein the substrate effectively acts as a counterelectrode surrounding the insulated drain regions of each of the one device memory cells. A pair of gates are disposed in insulating conduits which run perpendicular to the rows of memory cells. Each gate in a conduit is disposed in insulated spaced relationship with a memory cell channel region which, in response to signals on the gate turns on a column of channel regions so as to permit the entry of charge into a selected storage region when a bitline associated with a particular cell is energized. The resulting array shows rows of pairs of memory cells wherein each cell of a pair is spaced from the other by a portion of the substrate acting as a counterelectrode and each of the pairs of memory cells is similarly separated from an adjacent pair by regions of conductive material acting as a counterelectrode.

16 Claims, 8 Drawing Sheets

METHOD OF MAKING ULTRA DENSE DRAM CELLS

FIELD OF THE INVENTION

This is a divisional of application Ser. No. 264,418, filed Oct. 31, 1988, now U.S. Pat. No. 4,894,697.

This invention relates generally to dynamic random access, semiconductor memory arrays and more specifically relates to an ultra dense dynamic random access memory array. It also relates to a method of fabricating such arrays using a plurality of etch and refill steps which includes a differential etching step which is a key step in forming insulating conduits which themselves are adapted to hold a pair of field effect transistor gates of the adjacent transfer devices of one device memory cells. The differential etch step provides spaced apart device regions and an insulation region of reduced height between the trenches which space apart the memory cells. After isolating each device region with insulation, the spacing trenches and the insulation region of reduced height are refilled with conductive material. A subsequent etch step which brings the polycrystalline silicon below the level of the insulation region of reduced height sets the stage for the formation of gate conduits between columns of memory cells. An oxide formation step then forms an oxide on the etched polycrystalline silicon bringing it to the same level a the height of the insulation region of reduced height forming a continuous conduit of insulation material having substantially the same level across the array. After formation of a pair of gates in each of the thus formed conduits, the gates within each conduit are electrically isolated from each other, a device region in each of the memory cells is implanted to complete a field effect transistor transfer device and bitline metallization is formed to interconnect rows of memory cells. The lowermost portions of the device regions act as extended drains forming one electrode of a charge storage capacitor.

The resulting structure includes a plurality of rows of vertically arranged field effect transistors wherein the substrate effectively acts as a counterelectrode surrounding the insulated drain regions of each of the one device memory cells. A pair of gates are disposed in insulating conduits which run perpendicular to the rows of memory cells. Each gate in a conduit is disposed in insulated spaced relationship with a memory cell channel region which, in response to signals on the gate turns on a column of channel regions so as to permit the entry of charge into a selected storage region when a bitline associated with a particular cell is energized. The resulting array shows rows of pairs of memory cells wherein each cell of a pair is spaced from the other by a portion of the substrate acting as a counterelectrode and each of the pairs of memory cells is similarly separated from an adjacent pair by regions of conductive material acting as a counterelectrode. Of course, each row of memory cells is separated from adjacent rows by rows of dielectric material which include regions of reduced height which also form part of the conduits in which cell wordlines are disposed.

BACKGROUND OF THE INVENTION

The formation of trenches using various masking and etching techniques is well-known in the prior art. Similarly, the refilling of trenches for isolation and device forming purposes is also well-known. An article entitled "Self-Aligning Multi-Depth Trenches" in the IBM Technical Disclosure Bulletin, Vol. 28, No. 3, August 1985, page 1235 shows the formation of orthogonally disposed deep and shallow trenches which can be refilled with a suitable material. In the article, the trenches are used to obtain both deep and shallow isolation. The isolated epitaxial areas are subsequently utilized t form bipolar devices.

U.S. Pat. No. 4,520,553, filed Jan. 16, 1984, shows a semiconductor device with a deep grid accessible via the surface having a silicon substrate and comprising U-shaped grooves. The upper parts of the sidewalls of the grooves are insulated by a silicon layer and the lower parts of the grooves connect up with heavily doped zones. Polycrystalline silicon provides ohmic contact between selected positions on the upper face of the transistor and the grid layer. The reference basically shows the formation of grooves, filling with polysilicon and outdiffusing to provide dopant regions at the bottom of the grooves. While there are interconnections between rows of devices, there are no connections between devices in an orthogonal direction. Differential etching is not contemplated in the method of this reference.

U.S. Pat. No. 4,510,016, filed Dec. 9, 1982, shows a submicron structure including a plurality of fingers which are thinned down by the repeated oxidation and stripping of the walls of a U-shaped groove. In this reference a portion of each of the devices is formed by etching grooves in a semiconductor. The regions between the grooves are left open so that in a subsequent metallization step both emitter and self-aligned Schottky barrier contacts can be formed. The spacing between the devices is in only one direction.

An abstract of Japanese Patent No. 59-19366, filed Jan. 31, 1984, shows a vertical field effect transistor memory cell disposed within an isolation region which is itself formed in a semiconductor substrate counter-electrode. In this arrangement, a groove is formed in the semiconductor substrate which is refilled with polycrystalline silicon. After planarizing, layers of semiconductor from which a channel region and source of an FET device are to be formed are disposed atop the polished polycrystalline. To the extent that the layers formed on the polycrystalline semiconductor are themselves polycrystalline in character, these layers must be rendered single crystal by a technique called laser recrystallization. Further masking and etching steps form a pedestal of these layers which are then surrounded with insulating material up to the level of the polycrystalline in the mesa. A polycrystalline silicon gate is then disposed in insulated spaced relationship with the channel region. The gate is then electrically insulated and metallization applied to the single crystal semiconductor source region to form bitlines which are disposed orthogonal to the polycrystalline gate which forms a wordline for a column of similar memory cells. Thus, while a vertical device is formed, its structure and method of fabrication are such that techniques like laser recrystallization must be invoked providing, at best, epitaxial regions of questionable quality for the transfer device of each memory cell. In the technique just described, a straightforward etch and refill technique is involved without invoking the differential etch technique of the present application.

It is, therefore, an object of the present invention to provide an ultra dense DRAM memory array wherein each memory cell is made of a vertical single crystal, device regions wherein the single crystal material requires no special technique to form it other than epitaxial disposition and etching.

Another object is to provide a method for forming an ultra dense DRAM memory array wherein a differential etching step is utilized to simultaneously etch two different materials at different rates such that transistor device regions are formed and the height of insulating conduits to be formed subsequently is predetermined.

Still another object is to provide an ultra dense DRAM memory array wherein the width of the active device region is defined by a spacer smaller than the lithographic limit.

Yet another object is to provide an ultra dense memory array wherein pairs of wordlines are formed in insulating conduits portions of which are formed from isolation regions of reduced height and other portions of which are formed from oxidized portions of a common conductive counterelectrode.

BRIEF SUMMARY OF THE INVENTION

This invention relates to an integrated circuit memory array which contains a plurality of vertically arranged memory cells and to its method of fabrication. The memory array includes a plurality of dynamic random access memory (DRAM) cells which are vertically arranged field effect transistors. Each portion of the field effect transistors is formed from epitaxially deposited, single crystal semiconductor material. Each transistor has an extended drain region which is disposed in insulated spaced relationship with a common counterelectrode which is connected to the substrate. Wordlines are spaced from the channel region of associated transistors by means of gate oxides and pairs of such wordlines are disposed in gate conduits in insulated spaced relationship with the material that forms the counterelectrode. The wordlines are buried in oxide which partially supports orthogonally disposed bitlines which contact the exposed implanted sources of each of the field effect transistors.

The above described structure is formed by first etching trenches in underlying substrate regions which are spaced from each other by an oxide layer. The trenches are filled with insulating material. The resulting structure is then masked and differentially etched so that a plurality of rows of trenches are formed in the substrate portions and oxide spacer regions. Simultaneously, the unmasked portions of the previously formed insulation is reduced in height to a desired level during the etching of the rows of trenches. In a succeeding step, the trench walls are covered with insulation and the trenches and the regions over the reduced height insulation regions are refilled with semiconductor material. The refilled semiconductor is then etched down to a desired height in certain of the refilled trenches, covered with an oxide and the resulting trench is conformally covered with conductive material. In a subsequent step, the conductive material is etched leaving pairs of gate conductors extending orthogonally to the rows of field effect transistors. After burying the gate conductors which act as wordlines for adjacent field effect transistors, source regions are formed and bitline metallization is formed on the exposed sources completing the fabrication of an ultra dense DRAM memory array.

The foregoing and other objects, features and advantages of the present invention will become more apparent from the following more particular description of a preferred embodiment.

DESCRIPTION OF A PREFERRED EMBODIMENT

Figure 1:
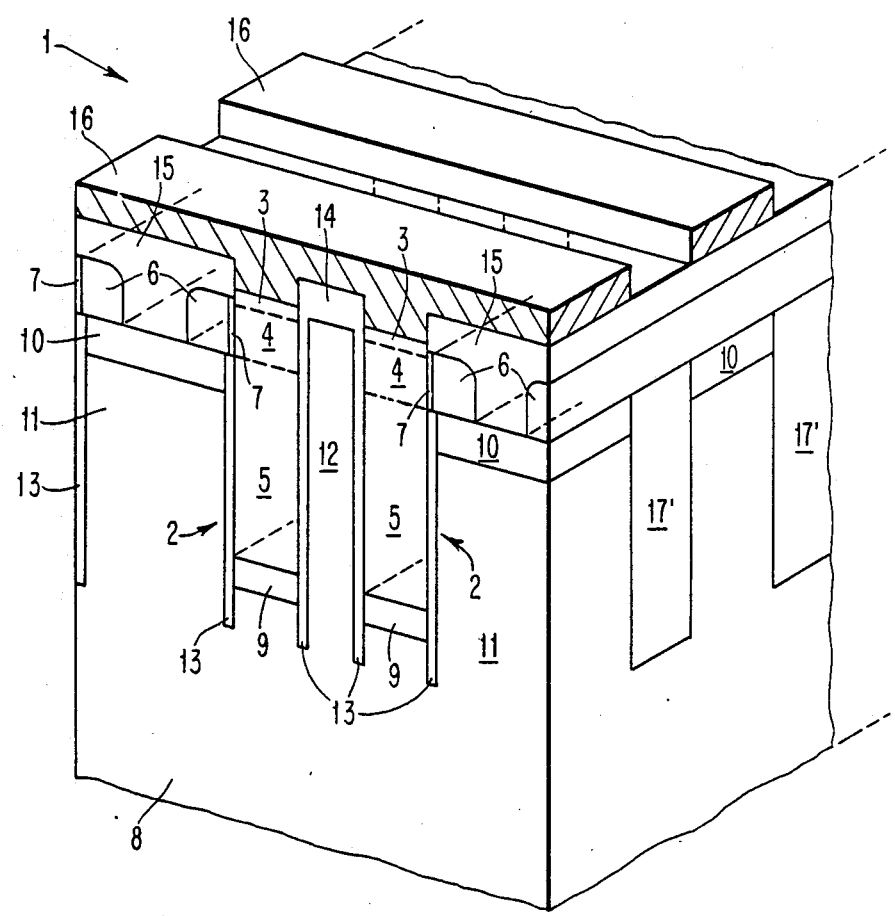
FIG. 1 is a cross-sectional perspective view of an integrated circuit memory array which contains a plurality of vertically arranged memory cells.

FIG. 1 is a cross-sectional perspective view of an integrated circuit memory array which contains a plurality of vertically arranged memory cells in accordance with the teaching of the present invention. Memory array 1 includes a plurality of dynamic random access memory (DRAM) cells 2 which are vertically arranged field effect transistors. Each cell 2 includes an n conductivity type source region 3, a p conductivity type channel region 4 and an extended n conductivity type drain region 5. A polycrystalline silicon gate 6 is shown in FIG. 1 disposed in insulated spaced relationship with an associated channel region 4 by means of a gate oxide 7 for each cell 2. Extended drain region 5 is also disposed in insulated spaced relationship with n+ conductivity type silicon substrate 8 by means of an oxide layer 9. Gates 6 are shown in FIG. 1 disposed on insulating oxide regions 10 which space them from n+ polycrystalline silicon regions 11. The latter regions are in direct contact with an n+ single crystal silicon semiconductor substrate 8 which ties all the n+ polycrystalline regions 11 together. Another n+ polycrystalline region 12 is shown in FIG. 1 disposed between cells 2 and spaced from them by composite nitride/oxide insulating elements 13. Similar elements 13 space cells 2 from insulating oxide regions 10 and n+ polycrystalline silicon regions 11. Polycrystalline silicon region 12 is capped with an oxide layer 14 and the regions between and over polycrystalline silicon gates 6 are filled with a flat topped, CVD oxide region 15. Conductive bitlines 16 are disposed orthogonally to gates 6 and extend from one side of memory array 1 to the other. In FIG. 1, bitlines 16 are connected to source regions 3 of DRAM cells 2. Thus, bitlines 16 are connected to rows of memory cells 2 and apply one of the potentials required to store information in the extended drain regions 5 of cells 2 which also act as one electrode of a storage capacitor. In the arrangement of FIG. 1, n+ polycrystalline regions 11,12 act as the other electrode of the storage capacitor. In FIG. 1, rows of memory cells 2 are spaced from each other by oxide isolation regions 17 which extend across memory array 1 in a direction parallel to bitlines 16 and perpendicular to gates 6. Flat topped CVD oxide regions 15 extend over the flat tops of isolation regions 17' and along with oxide layer 14, support bitlines 16 in insulated spaced relationship from each other except where they contact source regions 3. As with all memory cells of the character just described, wordlines 6, when selected, have an appropriate potential applied thereto which switches the selected memory cell 2 to store a digital "1" or "0". A selected bitline 16, as suggested hereinabove, applies a desired potential to all of source regions 3 of memory cells 2 in the selected row and that potential along with the selected gate 6 selects one memory cell 2 out of all the available memory cells in a well-known manner.

Figure 2:
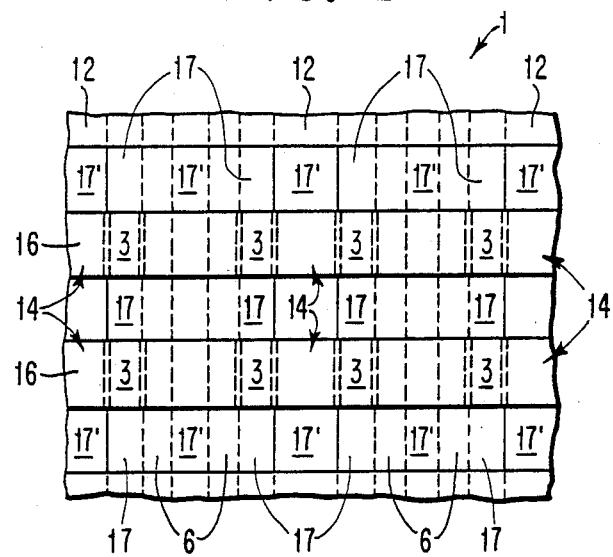
FIG. 2 is a top view of the memory array of FIG. 1 showing the layout of the Dynamic Random Access Memory (DRAM) cells and their associated polycrystalline silicon gates and bitlines. Oxide isolation is shown extending between rows of memory cells.

Referring now to FIG. 2, there is shown therein a top view of memory array 1 showing the layout of DRAM cells 2 and their associated polycrystalline silicon gates 6 and bitlines 16. Oxide isolation regions 17 and 17' are also shown extending from one side of array 1 to the other.

Integrated circuit array of memory cells shown in FIGS. 1 and 2 may be fabricated into a highly dense array which, because of the vertical positioning of memory cells 2, is not subject to deleterious short channel effects.

Figure 3:
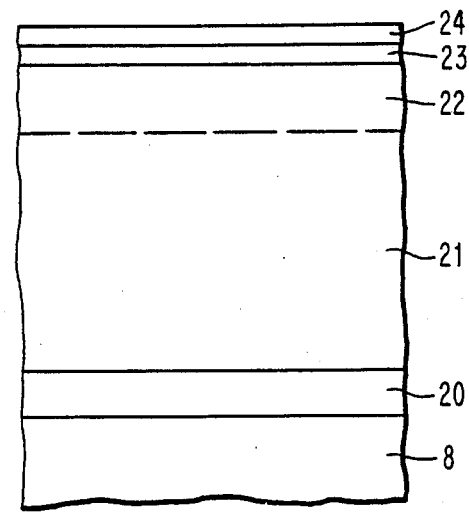
FIG. 3 shows a cross-sectional view of the memory array of FIG. 1 at an intermediate stage in its fabrication.

FIG. 3 shows a cross-sectional view of memory array 1 at an intermediate stage in its fabrication process. In an initial series of steps, n+ conductivity type silicon substrate 8 is covered with an oxide layer 20 portions of which remain in the final structure as oxide layer 9. Another n+ substrate 21 which contains a p− region 22 is bonded with oxide layer 20 in a manner well-known to those skilled in the semiconductor fabrication art. One way of achieving such bonding is shown in an article entitled "Silicon-On-Insulator (SOI) By Bonding and Etch-Back" by J. Lasky et al, IEDM 85, page 684. A layer of silicon nitride 23 and a layer of chemically vapor deposited silicon dioxide 24 are deposited on the surface of layer 22 which may have been previously epitaxially deposited or ion implanted or diffused to render it of p− conductivity type.

Figure 4:
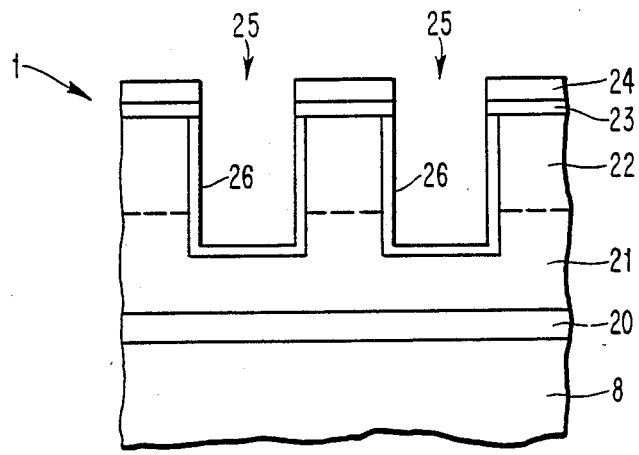
FIG. 4 is a cross-sectional view of the structure of FIG. 3 after it has been subjected to photolithographic, etching and oxidation steps.

FIG. 4 is a cross-sectional view of the structure of FIG. 3 after it has been subjected to photolithographic, etching and oxidation steps which form oxide covered trenches which extend through p− region 22 into n+ substrate 21. In FIG. 4, trenches 25 are formed by first depositing a photoresist, patterning and developing it. The exposed portions of oxide layer 24 and nitride layer 23 are removed by a Reactive Ion Etching (RIE) step using $CF_4+H_2$ as an etchant gas. After the remaining photoresist is removed, memory array 1 is subjected to an RIE step which etches through the unmasked portions of p− layer 22 and into n+ substrate 21. The resulting trenches 25 are then subjected to a thermal oxidation step which forms a thermal oxide layer 26 on the walls of trenches 25. Semiconductor substrate 21 and p− region 22 are reactively ion etched using $Cl_2+O_2$ as an etchant gas in a well-known way.

Figure 5:
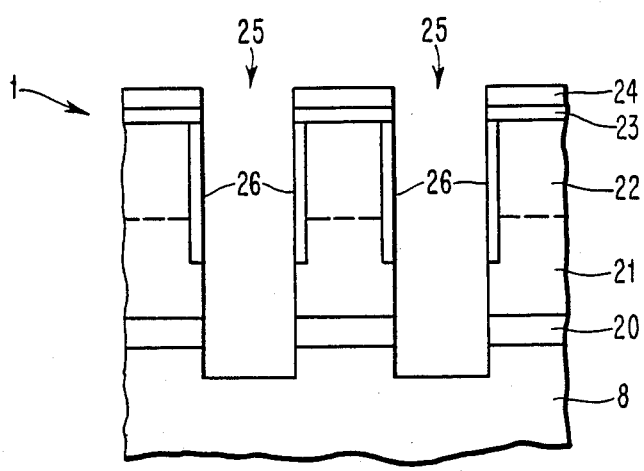
FIG. 5 shows the structure of FIG. 4 after it has been subjected to a further reactive ion etching step.

FIG. 5 shows the structure of FIG. 4 after it has been subjected to a further reactive ion etching step. In FIG. 5, that portion of thermal oxide layer 26 which is disposed on the bottom of trench 25 is first removed by subjecting it to a reactive ion etching step using $CF_4+H_2$ etch the oxide in a well-known manner. After the oxide on the bottom of trench 25 is removed, reactive ion etching is continued using $Cl_2+O_2$ to etch the semiconductor of n+ substrate 21 down to oxide layer 20. At this point, the etchant gas is changed to $CF_4+H_2$ to reactively ion etch oxide layer 20. Once layer 20 has been penetrated, the etchant gas is changed to $Cl_2+O_2$ to penetrate into substrate 8 to a depth which will be approximately the same depth as the depth of trench capacitors which will be formed in subsequent steps.

Figure 6:
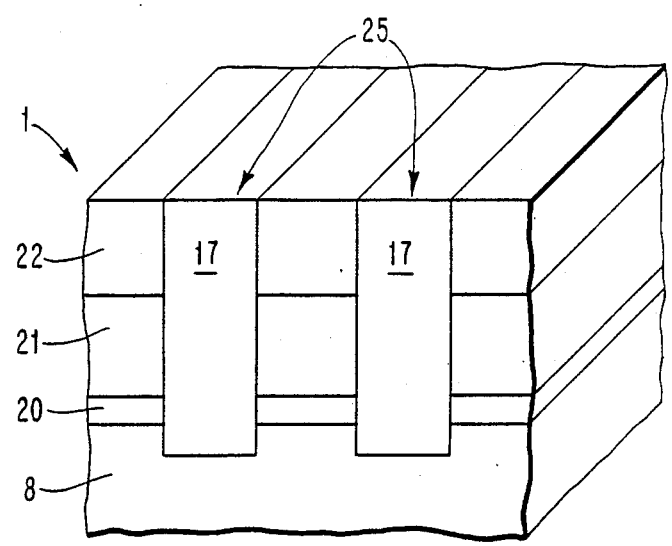
FIG. 6 shows the structure of FIG. 5 in perspective after it has been subjected to a trench refill, planarizing and polishing steps.

Referring now to FIG. 6, the structure of FIG. 5 is shown in perspective after it has been subjected to a trench refill and planarizing and polishing steps. After trenches 25 have been reactively ion etched to the desired depth, a thermal oxide (not shown) is grown on the unoxidized portions of the trench sidewalls. After this, trenches 25 are refilled with a chemically vapor deposited oxide using TEOS or other well-known chemical vapor deposition technique. Then, using the remaining portions of nitride layer 23 as an etch stop, the chemically vapor deposited oxide in trenches 25 is chemically-mechanically polished to provide the planarized structure of FIG. 6. In FIG. 6, the chemically vapor deposited oxide is intended to be an oxide isolation which will extend across memory array 1 in a direction parallel to bitlines 16 and a portion of it, after further processing steps, will become oxide isolation regions 17 as shown in FIG. 2. To the extent that the character of the oxide isolation regions 17 in FIG. 6 do not change but will only be reduced in height due to the further processing steps, the reduced height portions will be designated by the reference character 17' where appropriate.

At this point in the fabrication process, memory array 1 has been converted through a plurality of masking and etching steps into a structure containing a plurality of oxide filled isolation trenches 17 which extend through an oxide layer 20 into an underlying silicon substrate 8. The height of array 1 is substantially unchanged at this point but, for purposes of orientation, it should be appreciated that oxide isolation regions 17 extend across array 1 in a direction parallel to bitlines 16 as shown in FIG. 1.

Figure 7:
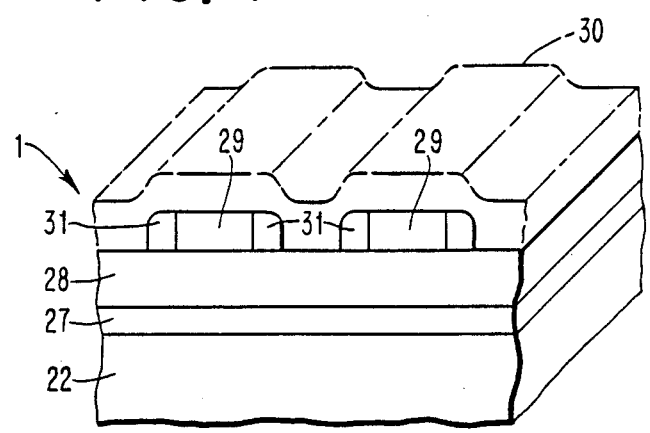
FIG. 7 shows a cross-sectional perspective view of a portion of the memory array of FIG. 1 after its polished surface has been subjected to further processing steps.

Referring now to FIG. 7, there is shown a cross-sectional, perspective view of a portion of memory array 1 after the polished surface of array 1 has been subjected to further processing steps. The perspective view shown in FIG. 7 is orthogonal to the view shown in FIG. 6. After the polishing step described in connection with FIG. 6, layers of silicon nitride 27, CVD oxide 28 and silicon nitride 29 are deposited in a well-known way in succession. Nitride layer 29 is shown in FIG. 7 after it has been patterned using well-known photolithographic and etching techniques. Nitride layer 29 is patterned so that the width and pitch size of the resulting nitride regions are larger than the minimum feature; larger than 0.5 microns, for example. After nitride layer 29 has been patterned, preferably by an RIE step using $CH_3F+CO_2$ as an etchant, a layer 30 of chemically vapor deposited polysilicon is formed having the configuration shown by the dashed lines in FIG. 7 which represent its shape prior to a reactive ion etching step. After being subjected to a reactive ion etching step, a plurality of polysilicon sidewall spacers 31 are formed alongside the portions of nitride layer 29 which remained after it was patterned. Spacers 31 are to be used to pattern oxide layer 28 and nitride layer 27 after the remaining portions of nitride layer 29 are removed using a suitable etchant such as phosphoric acid. Layers 27 and 28 are patterned using well-known etching techniques. The preferred way using RIE with $CF_4+H_2$. At this point, portions of the silicon surface and the tops of insulation filled trenches 17 of memory array 1 are exposed. These exposed silicon and insulation regions are then subjected to a reactive ion etching step using $Cl_2+O_2$ as an etchant gas providing trenches 32 and insulation regions of reduced height 17', as shown in FIG. 8.

Other gas mixtures which may be used to achieve a differential etch rate between silicon and silicon dioxide are shown in TABLE I below. Using the different gas mixtures in a reactive ion etching mode, permits, as can be seen from TABLE I, the achievement of different etch rates for the two materials resulting in a process step which permits very accurate control of the final depth of trenches 32 and height of insulation region 17'.

| RELATIVE REACTIVE ION ETCHING RATES OF: | | |
|---|---|---|
| Si | $SiO_2$ | GAS MIXTURE USED |
| 1,2 | 1 | $CF_4$ |
| 2~5 | 1 | $CF_4 + O_2$, $CHF_3 + O_2$ |
| 5~10 | 1 | $CHF_3$ |
| >10 | 1 | $Cl_2 + BCl_3 + He + O_2$ or $SiCl_4 + Cl_2 + BCl_3 + He + O_2$ |

Figure 8:
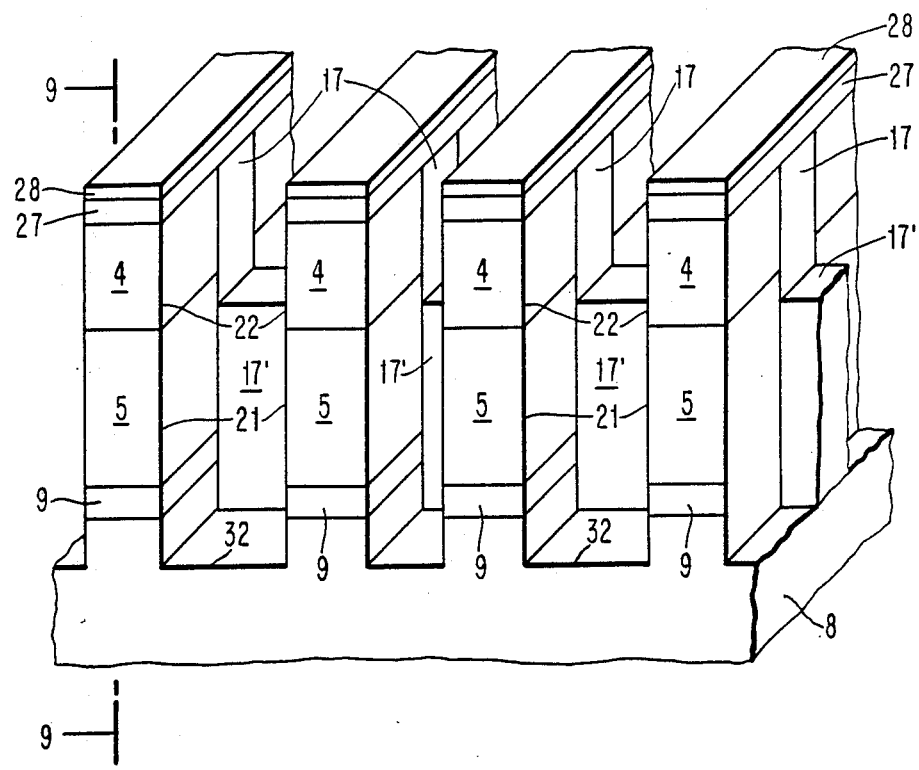
FIG. 8 is a cross-sectional perspective view of FIG. 7 on a slightly expanded scale after the structure of FIG. 7 has been subjected to reactive ion etching.

FIG. 8 is a cross-sectional, perspective view of FIG. 7 on a slightly expanded scale after the structure of FIG. 7 has been subjected to reactive ion etching using portions of layers 27,28 as masks. The resulting trenches 32 extend from the surface of array 1 through $p^-$ region 22, $n^+$ substrate 21 and oxide regions 9 into $n^+$ substrate 8. As a result of the reactive ion etching step, a plurality of upstanding single crystal semiconductor regions are disposed on oxide regions 9 which prior to etching of trenches 32 formed portions of layer 20. Substrate 21 and $p^-$ region 2 are intended to form portions of DRAM cells 2 and are shown in FIG. 1 as p conductivity type channel regions 4 and extended n conductivity type drain regions 5. Regions 4, 5 are shown by these same underlined reference characters 4, 5 in FIG. 8 to show the relationship of these regions to the structure of FIG. 1. The underlined reference characters will be used to identify the same regions in the following description.

At this point, a reference should be made to FIG. 6 which shows array 1 after isolation oxide 17 has been formed in trenches 25. It should be recalled that after the steps which formed isolation oxide regions 17, the height of array 1 was substantially unchanged from its initial starting height. FIG. 8 shows an isolation oxide region 17 having portions 17' of reduced height from those shown in FIG. 6. This results from the fact that during the reactive ion etching step which forms trenches 32, portions of the tops of isolation oxide region 17 were left unprotected intentionally to permit a reduction in the height of those unprotected portions of isolation oxide regions 17 to a desired level. A consideration of FIGS. 9 and 10 clearly shows that the height of isolation oxide regions 17 remains that same where protected by layers 27,28 and is reduced in regions where the underlying portions of memory array 1 have not been protected by layers 27,28.

Figure 9:
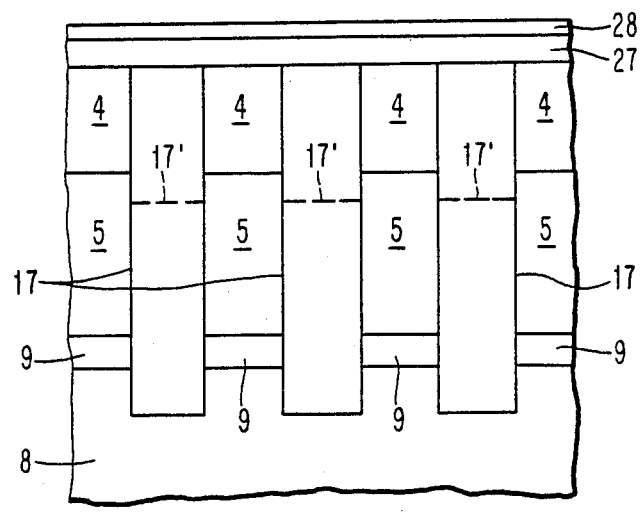
FIG. 9 is a cross-sectional view of that portion of FIG. 8 taken along line 9—9 of FIG. 8.

Referring now to FIG. 9, there is shown a cross-sectional view of that portion of FIG. 8 taken along line 9—9 of FIG. 8. From FIG. 9, it should be clear that those regions of memory array 1 and isolation oxide regions 17 which are covered by layers 27, 28 are protected during the reactive ion etching step which forms trenches 32. In this manner, the upstanding regions 4, 5 are spaced from each other by isolation oxide regions 17 in a direction perpendicular to the direction of bitline 16 as shown in FIGS. 1 and 2. From the foregoing, it should be clear that by appropriate masking and using a single reactive ion etching step that both the height of isolation oxide regions 17 can be adjusted where desired to the height of oxide regions 17', for example, and the depth of trenches 32 controlled simultaneously.

Figure 10:
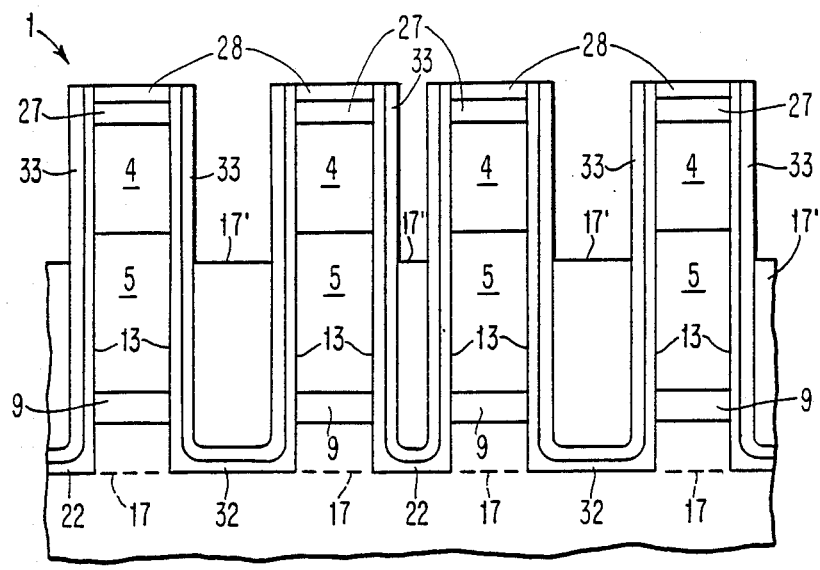
FIG. 10 is a cross-sectional view of FIG. 8 at a later intermediate stage in its fabrication.

FIG. 10 is a cross-sectional view of FIG. 8 at a later intermediate stage in its fabrication. FIG. 10 shows a composite oxide-nitride layer 13 formed on the sidewalls of trenches 32. A thin, $n^+$ polycrystalline silicon layer 33 is deposited on top of layer 13 to protect composite dielectric layers 13 during a subsequent reactive ion etching step.

Figure 11:
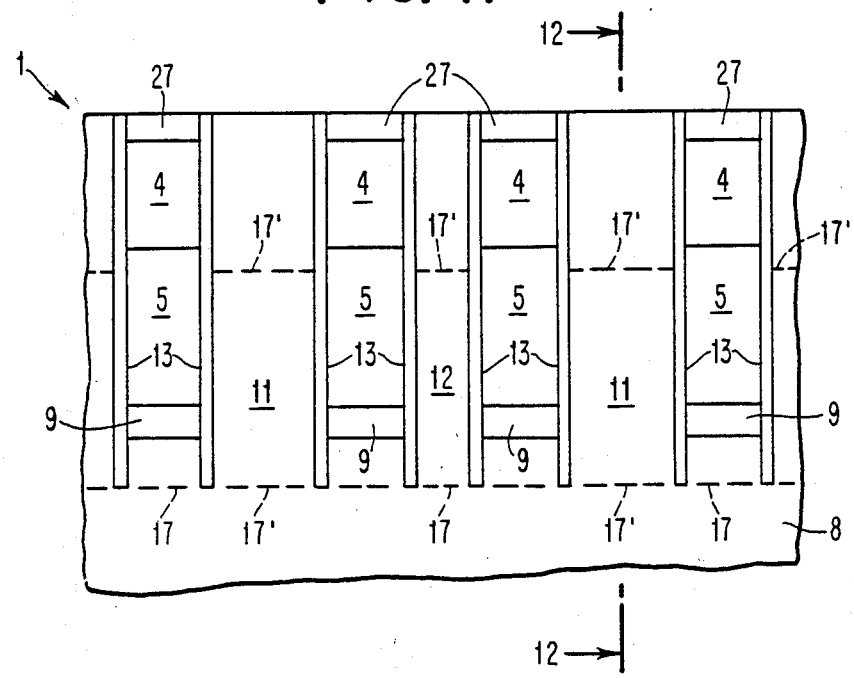
FIG. 11 shows the structure of FIG. 10 at a still later intermediate stage in its fabrication after the semiconductor trenches and reduced height insulation regions have been refilled with polycrystalline silicon.

FIG. 11 shows the structure of FIG. 10 at a still later intermediate stage in its fabrication. In FIG. 11, array 1 is subjected to another reactive ion etching step to remove polycrystalline layer 33 from the bottoms and sidewalls of trenches 32 and to remove those portions of composite layers 13 which are disposed on the bottoms of trenches 32. After the bottoms of trenches 32 are exposed, $n^+$ polysilicon 11,12 is deposited to fill in trenches 32. FIG. 11 shows the resulting structure after a chemical-mechanical polishing step is utilized to planarize the surface of array 1. In this latter step, nitride layers 27 act as etch stops. While not absolutely clear from FIG. 11, it should be appreciated that when polycrystalline silicon 11,12 is chemically deposited into trenches 32, polycrystalline silicon is also deposited on top of isolation oxide regions 17' which have been reduced in height due to a previous RIE step of isolation oxide regions 17.

Figure 12:
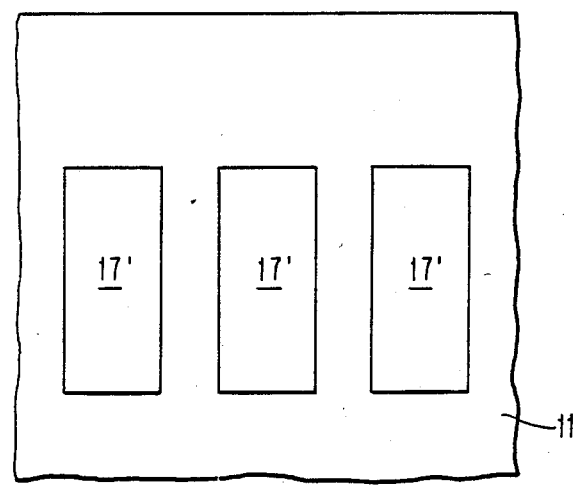
FIG. 12 is a cross-sectional view taken along line 12-12 of FIG. 11 showing isolation oxide regions of reduced height surrounded by polycrystalline silicon.

FIG. 12 which is a cross-sectional view taken along line 12—12 of FIG. 11 shows isolation oxide regions 17' surrounded by polycrystalline silicon 11. The height reduction of isolation oxide regions 17 to isolation regions 17' of lesser height as has been previously indicated is a key part of the fabrication process because it ultimately allows for the formation of polysilicon gates all of which are connected together on a single level to form the memory array word lines.

Figure 13:
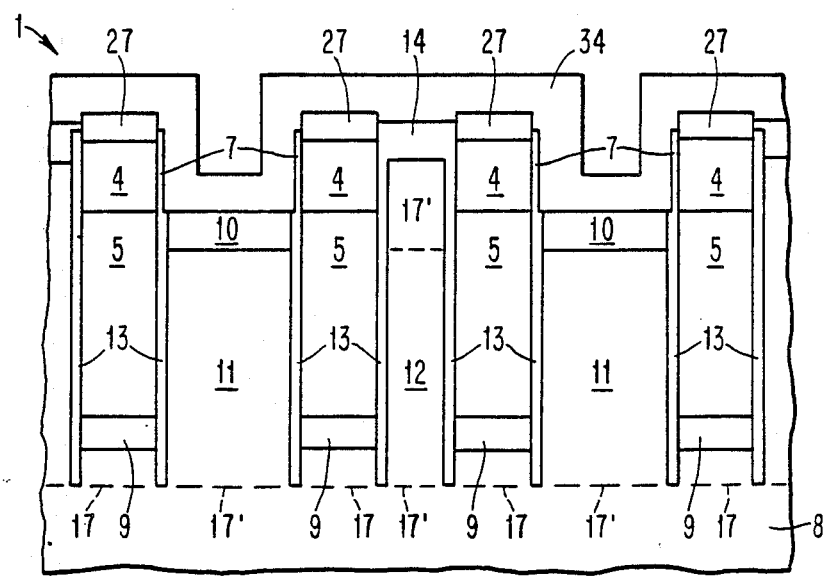
FIG. 13 shows a cross-sectional view of FIG. 11 at a still later intermediate stage in its fabrication.

Referring now to FIG. 13, there is shown a cross-sectional view of FIG. 11 at a still later intermediate stage in the fabrication of memory array 1. FIG. 13 shows a pair of insulating oxide regions 10 disposed atop n+ polycrystalline regions 11. An oxide layer 14 is shown disposed atop n+ polycrystalline region 12 which was formed at the same time as polycrystalline regions 11. Finally, FIG. 13 shows a layer 34 of n+ polycrystalline silicon portions of which will remain after further fabrication steps as polycrystalline silicon gates 6 as shown in FIG. 1.

The structure of FIG. 13 is obtained by first carrying out a lithography step to provide a resist mask (not shown) to prevent etching of polycrystalline region 12. The unmasked n+ poly regions 11 are then reactively ion etched until the level of the reduced height of oxide isolation regions 17' is reached. The reactive ion etching step leaves a polysilicon residue on composite nitride/oxide elements 13 which extend above region 11. After all the masking photoresist is removed, the polycrystalline silicon residue and the same amount of poly over polycrystalline region 12 are removed by etching. The tops of polycrystalline regions 11 and 12 are then oxidized to provide insulating oxide regions 10 over the former and oxide layer 14 over the latter. During this oxidation step, only the polycrystalline silicon regions 11,12 will be oxidized since the nitride surface of composite oxide/nitride layers 13 prevents any further oxidation. At this point, the portions of composite elements 13 extending above oxide regions 10 are removed using well-known oxide and nitride etchants and a thin gate oxide 7 is thermally grown. Finally, a layer 34 of n+ polycrystalline silicon is chemically vapor deposited in a well-known way over oxide region 10, oxide layer 14 and those portions of nitride layer 27 which remain over p conductivity type channel regions 4.

Figure 14:
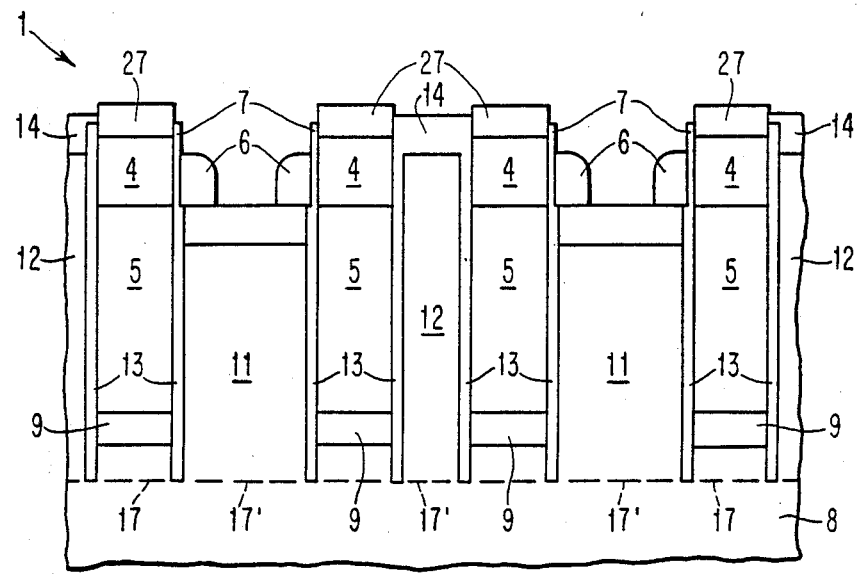
FIG. 14 shows a cross-sectional view of FIG. 13 after polycrystalline silicon device gates have been formed.

FIG. 14 shows a cross-sectional view of FIG. 13 after layer 34 of polycrystalline silicon has been reactively ion etched to form polysilicon spacers which are the polycrystalline gates 6 shown in FIG. 1. At this point, it should be noted that n+ polycrystalline layer 34 has been deposited everywhere and, as such, forms over the surface of insulating oxide regions 10 and over the reduced height oxide isolation regions 17' which are approximately the same height as the polycrystalline silicon regions 11. Thus, when polycrystalline silicon layer 34 is subjected to a reactive ion etching step, the polycrystalline silicon sidewalls which remain extend across insulating oxide regions 10 and the surfaces of the reduced height oxide isolation regions 17' as shown in FIG. 1 forming the wordlines of memory array 1. The flat topped oxide regions 10 together with regions 17' form a plurality of gate conduits in each of which is disposed a pair of gates 6 which are completely insulated from any portion of substrate 8.

Figure 15:
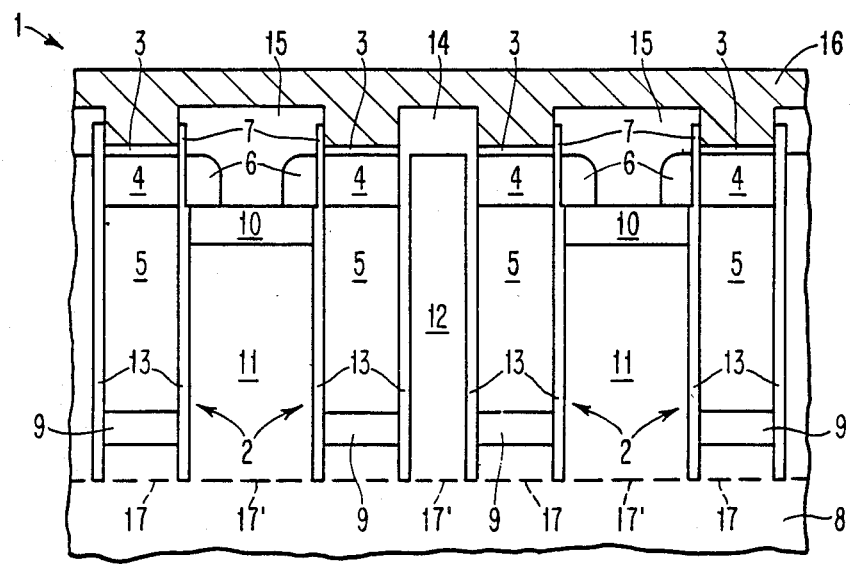
FIG. 15 shows a cross-sectional view of FIG. 14 after the surface of the memory array has been planarized, source regions have been ion implanted and the bitline metallization deposited and patterned.

Referring now to FIG. 15, there is shown therein a cross-sectional view of FIG. 14 after the surface of array 1 has been planarized, source regions 3 have been ion implanted and the bitline metallization deposited and patterned.

After silicon gates 6 have been formed, silicon dioxide is chemically vapor deposited in a well-known way over the surface of array 1 burying polycrystalline gates 6 in oxide regions 15. The resulting surface is then planarized in a well-known way by chemical-mechanical polishing using nitride regions 27 as an etch stop. Nitride regions 27 are then removed using a selective etch, such as phosphoric acid, so that the surfaces of p conductivity type regions 4 are exposed. Arsenic is then ion implanted to form n conductivity type source regions 3. Finally, with source regions 3 exposed, metallization such as aluminum, a silicide forming metal or highly doped polycrystalline silicon is deposited on the surface of array 1. After patterning, bitlines 16 are formed interconnecting all of source regions 3 in a self-aligned manner. The resulting structure is shown in FIG. 1. The pattern of cells 2 repeats to the left and right of the cells shown in FIG. 1 such that after a polycrystalline region 11, another memory cell 2 is formed after which another polycrystalline region 12 is provided; the latter being followed by another memory cell 2.

The structure of FIG. 1 may be implemented to prove an ultra dense array of memory cells 2. The process used contemplates the fabrication of devices wherein wordlines 6 have a width of 0.1 $\mu$m and the bitline width is in the range of 0.3~0.5 $\mu$m. Isolation regions 17' and memory cells 2 have widths in the same range. The width of channel region 4 of each memory cell 2 is also in the 0.3~0.5 $\mu$m range and because wordlines 6 overlap regions 4, the latter have slightly larger dimensions in the vertical direction.

To the extent that any semiconductor region of array 1 has been characterized as having a specific conductivity type, it should be appreciated that these same regions may be changed to opposite conductivity type without departing from the spirit of the present invention. Thus, while devices 2 of memory array 1 have been characterized hereinabove as npn field effect transistors, devices 2 could equally well be pnp devices, operation of which is well-known to those skilled in the semiconductor fabrication arts.

Having thus described our invention, what we claim as new, and desire to secure by Letters Patent is:

1. A process for fabricating an ultra dense DRAM memory array comprising the steps of:
forming a first plurality of trenches in a semiconductor substrate which is spaced from an underlying substrate by an insulating layer which extends through said semiconductor substrate and said insulating layer into said underlying substrate said trenches having a given depth and extending in a given direction,
refilling said plurality of trenches with an insulating material,
forming a second plurality of trenches in said semiconductor substrate through said semiconductor substrate and said insulating layer into said underlying substrate to said given depth leaving a plurality of active device regions and simultaneously excavating portions of said insulating material from said first plurality of trenches between said second plurality of trenches to a depth less than said given depth,
refilling said second plurality of trenches and said excavated portions of said first plurality of trenches with a conductive material, removing said conductive material from said excavated portions of said first plurality of trenches to expose the surfaces of said insulating material therein and from selected of said second plurality of said refilled trenches to a depth below said depth less than said given depth to form a plurality of flat topped regions of said conductive and said insulating materials which extend in a direction orthogonal to said given direction, oxidizing said plurality of flat topped regions of conductive material such that the tops of the resulting insulating oxide are at the same level as the tops of said flat topped regions of insulating material forming a plurality of gate conduits extending in a direction orthogonal to said given direction, forming a pair of conductive gate elements in each of said gate conduits each of said conductive gate elements being disposed in insulted spaced relationship with adjacent active device regions of said plurality of active device regions.

2. A process according to claim 1 further including the step of:

forming flat topped insulation in said gate conduits to electrically isolate each one of said pairs of conductive gate elements from each of the other of said pairs of conductive gates, implanting said plurality of device regions with a conductivity type determining impurity to form a plurality of implanted device regions, and depositing and patterning a plurality of conductive lines extending in said given direction each of which contacts a number of said plurality of implanted device regions.

3. A process for forming an ultra dense dynamic random access memory array comprising the steps of:

forming a first plurality of insulation filled trenches in a semiconductor substrate of first height, forming a second plurality of trenches orthogonally with said first plurality of trenches in said substrate and in portions of said insulation filled trenches leaving a plurality of semiconductor regions of first height with gaps therebetween and a plurality of insulator regions of a second height less than said first height disposed between said insulator regions of said first height, refilling said second plurality of trenches such that selected of said gaps are partially filled with conductive and insulating material in that order exposing portions of said semiconductor regions extending above said partially filled gaps, the latter having a height equal to said second height, and forming a plurality of conductive gates orthogonal to said first plurality of trenches each said gate being disposed in insulated spaced relationship with a number of said exposed portions of said semiconductor regions and extending over said partially filled gaps and said insulator regions of said second height.

4. A process according to claim 3 further including the steps of insulating adjacent gates from each other, doping a portion of each portion of said semiconductor region extending above said partially filled gap to form a region of opposite conductivity type therein, and forming a plurality of conductive interconnections each said interconnection being connected to a plurality of said opposite conductivity regions and extending in the same direction as said first plurality of trenches.

5. A process according to claim 3 wherein said substrate includes a first layer of semiconductor material of first conductivity type having a region of second conductivity type extending from its surface partially into said first layer, said first layer being disposed over a second layer of said first conductivity type and spaced from said first layer by a layer of insulating material.

6. A process according to claim 3 wherein said semiconductor layers are made of single crystal semiconductor material.

7. A process for forming an ultra dense dynamic random access memory array comprising the steps of providing a first semiconductor substrate (21) of a first conductivity type having a region (22) of second conductivity type extending from the surface of said first substrate partially into said first substrate (21), said first substrate (21) being disposed over a second substrate (8) of first conductivity type and spaced from said first substrate (21) by a layer (20) of insulation, forming a first plurality of insulation filled trenches (17) (25) which extend from said surface into said second substrate (8) leaving a plurality of spaced apart upstanding regions consisting of portions of said first (21) and second substrates (8) and said insulation layer (20), forming a second plurality of trenches (32) in said plurality of upstanding regions which extend from said surface into said second substrate (8) leaving a plurality of device regions (4) (5) and simultaneously forming a third plurality of trenches in said insulation filled trenches (17) (25) each of said third plurality of trenches being disposed between a pair of trenches (32) of said second plurality of trenches (32) and extending partially into said insulation filled trench (17) (25) to a given depth, refilling said second (32) and third plurality of trenches with conductive material (11,12), forming a fourth plurality of trenches in selected of said second plurality of trenches (32) filled with conductive material (11) to a depth greater than said given depth, forming insulation (10) at the bottom of each of said fourth plurality of trenches to a thickness sufficient to raise the level of each of said fourth plurality of trenches to said given depth providing with the bottoms of said third plurality of trenches a plurality of insulating gate conductor channels extending orthogonally with respect to said insulation filled trenches (17) (25).

8. A process according to claim 7 further including the steps forming a pair of gate conductors (6) in each of said channels in insulated spaced relationship with adjacent device regions (4), depositing insulating material (15) in each of said channels to electrically isolate the gate conductors (6) in each channel from each other, introducing a first conductivity type dopant region (3) into said region of second conductivity type (4) in each of said device regions (4) (5), planarizing said insulating material (15), and forming a plurality of conductors (16) disposed in orthogonal relationship with said gate conductors (6) each of said conductors (16) contacting a plurality of said first conductivity type dopant regions (3).

9. A process according to claim 7 wherein said semiconductor substrates are made of single crystal semiconductor material.

10. A process according to claim 7 wherein said layer of insulation is silicon dioxide.

11. A process according to claim 7 wherein said insulation filled trenches are filled with silicon dioxide.

12. A process according to claim 7 wherein the step of forming a first plurality of insulation filled trenches includes the steps of: masking the surface of said first semiconductor substrate to expose portions of said surface, etching said substrate to form said plurality of trenches and chemically vapor depositing said insulation into said first plurality of insulation filled trenches.

13. A process according to claim 7 wherein the step of forming a second plurality of trenches and simultaneously forming a third plurality of trenches includes the steps of:

forming layers of a nitride, oxide and a nitride in that order on said surface and over said insulation filled trenches, patterning said last mentioned nitride layer leaving spaced apart nitride masking regions, depositing a layer of polycrystalline semiconductor conformally over said spaced apart nitride regions and reactively ion etching said polycrystalline semiconductor to form sidewall spacers on the sides of each of said spaced apart nitride masking regions, removing said spaced apart masking regions, patterning said first mentioned nitride layer and said oxide layer to expose surface portions of said substrate and said insulation filled trenches, and, reactively ion etching said exposed surface portion of said substrate and said insulation filled trenches to form said second and third plurality of trenches simultaneously.

14. A process according to claim 7 wherein the step of refilling said trenches with conductive material includes the steps of:

forming a composite oxide-nitride layer and a protective layer of polycrystalline semiconductor in said second plurality of trenches, subjecting said second plurality of trenches to reactive ion etching to remove said protective layer of polycrystalline layer from said second plurality of trenches and said composite oxide-nitride layer from the bottoms of said second plurality of trenches, depositing polycrystalline semiconductor material in said second and third plurality of trenches and, polishing said semiconductor material to planarize the surface of said memory array.

15. A process according to claim 7 wherein the step of forming a fourth plurality of trenches is selected of said second plurality of trenches filled with conductive material includes the steps of:

reactively ion etching said selected of said second plurality of trenches to form said fourth plurality of trenches in said conductive material.

16. A process according to claim 7 wherein the step of forming insulation at the bottom of each of said fourth plurality of trenches includes the step of oxidizing the topmost portion of said conductive material.

* * * * *